(12) United States Patent
Frank et al.

(10) Patent No.: US 12,332,302 B2
(45) Date of Patent: Jun. 17, 2025

(54) LIMITING CIRCUITRY WITH CONTROLLED PARALLEL DIRECT CURRENT-DIRECT CURRENT-CONVERTERS

(71) Applicant: Infineon Technologies AG, Neubiberg (DE)

(72) Inventors: Peter Johannes Frank, Regensburg (DE); Siegfried Schmid, Hemau (DE); Walter Johann Slamnig, Latschach (AT)

(73) Assignee: Infineon Technologies AG, Neubiberg (DE)

( * ) Notice: Subject to any disclaimer, the term of this patent is extended or adjusted under 35 U.S.C. 154(b) by 183 days.

(21) Appl. No.: 18/130,714

(22) Filed: Apr. 4, 2023

(65) Prior Publication Data

US 2023/0341461 A1     Oct. 26, 2023

(30) Foreign Application Priority Data

Apr. 25, 2022  (DE) .................... 10 2022 109 878.8

(51) Int. Cl.
*G01R 31/28*     (2006.01)
*H02M 1/00*     (2006.01)

(52) U.S. Cl.
CPC ....... *G01R 31/286* (2013.01); *G01R 31/2896* (2013.01); *H02M 1/0009* (2021.05)

(58) Field of Classification Search
CPC ........ G01R 19/16538; G01R 19/16571; G01R 31/2841; G01R 31/286; G01R 31/2896; H02M 1/0009; H02M 1/007; H02M 1/32; H02M 3/003; H02M 3/1584
See application file for complete search history.

(56) References Cited

U.S. PATENT DOCUMENTS

| | | | | |
|---|---|---|---|---|
| 5,481,427 A | * | 1/1996 | Ishikawa | G11B 15/442 360/137 |
| 7,245,134 B2 | * | 7/2007 | Granicher | G01R 31/31926 324/762.05 |
| 7,247,956 B2 | * | 7/2007 | Berger | G01R 31/31924 324/756.07 |
| 7,307,433 B2 | * | 12/2007 | Miller | G01R 1/07385 324/756.03 |
| 8,262,617 B2 | * | 9/2012 | Aeschlimann | H02J 9/061 307/64 |

(Continued)

FOREIGN PATENT DOCUMENTS

WO     2007/146583     12/2007

*Primary Examiner* — Vinh P Nguyen
(74) *Attorney, Agent, or Firm* — Dicke, Billig & Czaja, PLLC

(57) ABSTRACT

Limiting circuitry is disclosed. In one example, the limiting circuitry provides limited electric current and/or limited electric voltage for electrically testing at least one device under test. The limiting circuitry comprises a plurality of DC-DC-converters being connected in parallel to each other, each being provided with an electric input DC voltage and each being configured for providing a converted electric output current to be forwarded to an assigned one of electric contacts for contacting the at least one device under test. A control mechanism is configured for controlling the DC-DC-converters for limiting the electric output current and/or an electric output voltage which relates to said electric output current.

20 Claims, 3 Drawing Sheets

(56) References Cited

U.S. PATENT DOCUMENTS

| | | |
|---|---|---|
| 8,581,610 B2 | 11/2013 | Miller et al. |
| 11,757,465 B2 * | 9/2023 | Cherniak .............. H02M 3/157 341/172 |
| 2005/0237073 A1 | 10/2005 | Miller et al. |
| 2006/0091898 A1 | 5/2006 | Gaggl |
| 2008/0290882 A1 | 11/2008 | Rogers et al. |
| 2009/0273358 A1 | 11/2009 | Arkin |
| 2010/0213960 A1 | 8/2010 | Mok et al. |
| 2020/0064394 A1 | 2/2020 | Lee et al. |

* cited by examiner

LIMITING CIRCUITRY WITH CONTROLLED PARALLEL DIRECT CURRENT-DIRECT CURRENT-CONVERTERS

CROSS-REFERENCE TO RELATED APPLICATION

This Utility Patent Application claims priority to German Patent Application No. 10 2022 109 878.8 filed Apr. 25, 2022, which is incorporated herein by reference.

BACKGROUND

Technical Field

Various embodiments relate generally to a limiting circuitry, a tester, and a method of limiting electric current and/or electric voltage for electrically testing at least one device under test.

Description of the Related Art

After completing manufacture of semiconductor chips or packages of such semiconductor chips, such products are usually tested concerning their function. For this purpose, a tester comprising a prober and an electric test unit is provided in which such products are tested as devices under test (DUT).

Probe cards may be operated by a current limitation circuit for needle current protection. However, conventional current limitation circuits may have a big power loss. Moreover, such conventional current limitation circuits may be only applicable for pulse tests applying short pulses during testing. Furthermore, conventional current limitation circuits may be inappropriate for high current direct current (DC) tests, because such current limitation circuits may not be able to withstand power loss for longer pulses. Another shortcoming of conventional current limitation circuits is their limited accuracy and their incapability of balancing several probes or contacts.

There may be a need for safely and reliably testing a device under test with high accuracy.

SUMMARY

According to an exemplary embodiment, a limiting circuitry for providing limited electric current and/or limited electric voltage for electrically testing at least one device under test is provided, wherein the limiting circuitry comprises a plurality of direct current-direct current-converters being connected in parallel to each other, each being provided with an electric input direct voltage and each being configured for providing a converted electric output current to be forwarded to an assigned one of electric contacts for contacting the at least one device under test, and a control mechanism configured for controlling the direct current-direct current-converters for limiting the electric output current and/or an electric output voltage which relates to said electric output current.

According to another exemplary embodiment, a tester for testing at least one device under test is provided, wherein the tester comprises a prober for contacting the at least one device under test for testing the at least one device under test, and an electric test unit comprising a limiting circuitry having the above-mentioned features and being coupled with the prober for supplying electric signals to the at least one device under test and for receiving and analysing a plurality of response signals from the at least one device under test.

According to yet another exemplary embodiment, a method of limiting electric current and/or electric voltage for electrically testing at least one device under test is provided, wherein the method comprises connecting a plurality of direct current-direct current-converters in parallel to each other, providing each of the direct current-direct current-converters with an electric input direct voltage, generating, by the direct current-direct current-converters, a converted electric output current to be forwarded to an assigned one of electric contacts for contacting the at least one device under test, and controlling the direct current-direct current-converters for limiting the electric output current and/or an electric output voltage which relates to said electric output current.

According to an exemplary embodiment, a limiting circuitry for a tester for testing devices under tests (DUTs) is provided which limits current and/or voltage applied to the DUT. Advantageously, such a limiting circuitry comprises a parallel arrangement of direct current-direct current-converters (DC-DC-converters) each providing a corresponding limited current and/or voltage to electric contacts used for contacting the DUT during a test. Further advantageously, a control mechanism may be provided for controlling the DC-DC-converters for limiting the provided voltage and/or current. Such a limiting circuitry with a sequence of DC-DC-converters connected electrically in parallel and being controlled by a control mechanism in terms of testing DUTs has advantages: Firstly, the implementation of controlled DC-DC-converters may ensure a supply of electricity to the DUT with high efficiency. Furthermore, since it is possible to connect the DC-DC-converter modules in parallel, a high degree of flexibility and scalability may be achieved, as high current on one contact or balanced currents at a plurality of contacts is possible. The proposed limiting circuitry may also be failure tolerant, since DC-DC sourced contacts can even accept one or more poorly connected contacts, as the control mechanism may control all parallel DC-DC-converters for failure compensation. Such a control mechanism may lead, in turn, to a high up-time, a small risk of a repeated testing, and high-yield. By reliably limiting current and/or voltage, damage of a DUT may be reliably prevented. Since the construction of a limiting circuitry according to exemplary embodiments is very simple, the manufacturing effort may be kept at a reasonable level.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
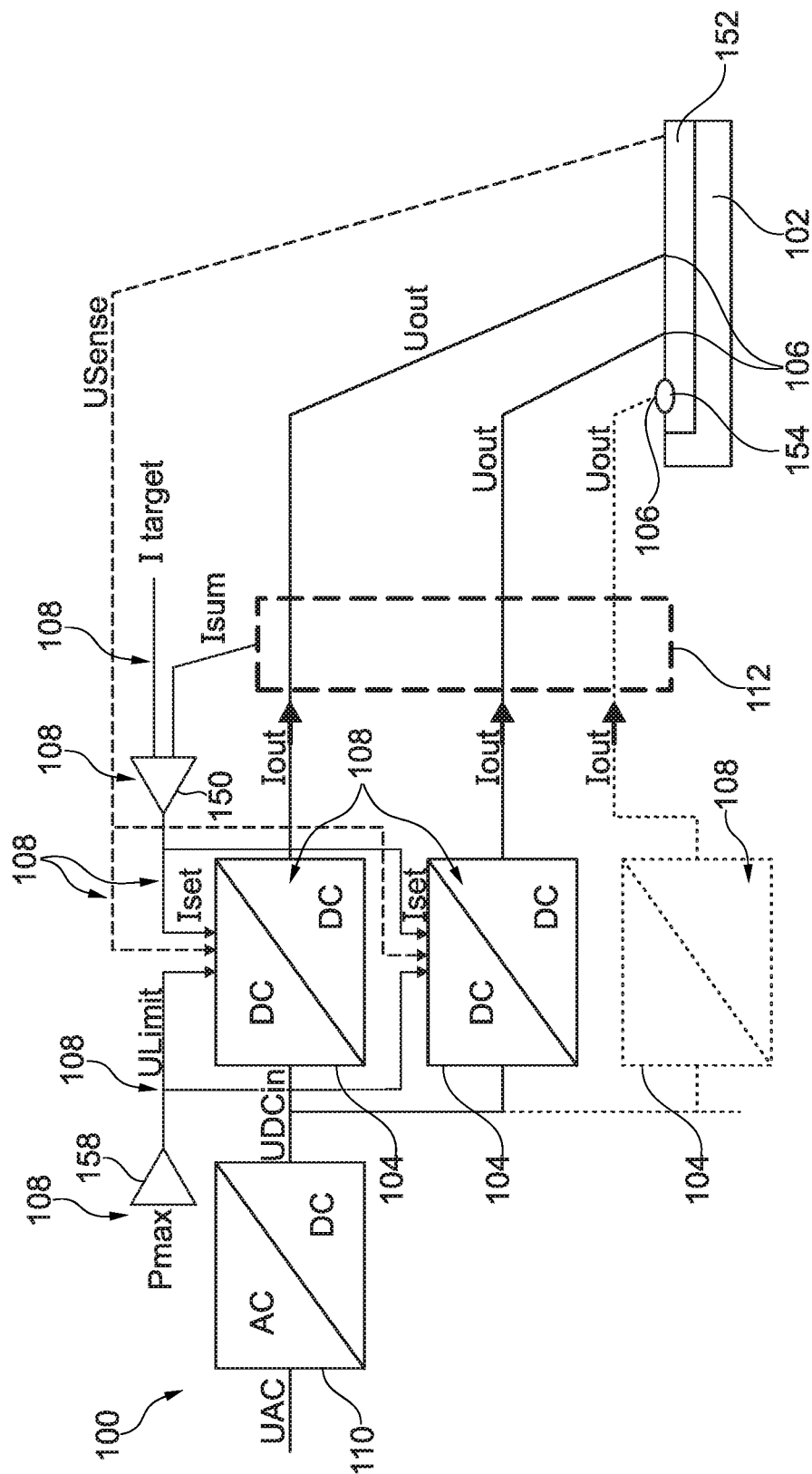
FIG. 1 shows a limiting circuitry for providing limited electric current and/or limited electric voltage for electrically testing at least one device under test according to an exemplary embodiment.

According to an exemplary embodiment, a limiting circuitry for providing limited electric current and/or limited electric voltage for electrically testing at least one device under test is provided, wherein the limiting circuitry comprises a plurality of direct current-direct current-converters being connected in parallel to each other, each being provided with an electric input direct voltage and each being configured for providing a converted electric output current to be forwarded to an assigned one of electric contacts for contacting the at least one device under test, and a control mechanism configured for controlling the direct current-direct current-converters for limiting the electric output current and/or an electric output voltage which relates to said electric output current.

According to another exemplary embodiment, a tester for testing at least one device under test is provided, wherein the tester comprises a prober for contacting the at least one device under test for testing the at least one device under test, and an electric test unit comprising a limiting circuitry having the above-mentioned features and being coupled with the prober for supplying electric signals to the at least one device under test and for receiving and analysing a plurality of response signals from the at least one device under test.

According to yet another exemplary embodiment, a method of limiting electric current and/or electric voltage for electrically testing at least one device under test is provided, wherein the method comprises connecting a plurality of direct current-direct current-converters in parallel to each other, providing each of the direct current-direct current-converters with an electric input direct voltage, generating, by the direct current-direct current-converters, a converted electric output current to be forwarded to an assigned one of electric contacts for contacting the at least one device under test, and controlling the direct current-direct current-converters for limiting the electric output current and/or an electric output voltage which relates to said electric output current.

According to an exemplary embodiment, a limiting circuitry for a tester for testing devices under tests (DUTs) is provided which limits current and/or voltage applied to the DUT. Advantageously, such a limiting circuitry comprises a parallel arrangement of direct current-direct current-converters (DC-DC-converters) each providing a corresponding limited current and/or voltage to electric contacts used for contacting the DUT during a test. Further advantageously, a control mechanism may be provided for controlling the DC-DC-converters for limiting the provided voltage and/or current. Such a limiting circuitry with a sequence of DC-DC-converters connected electrically in parallel and being controlled by a control mechanism in terms of testing DUTs has advantages: Firstly, the implementation of controlled DC-DC-converters may ensure a supply of electricity to the DUT with high efficiency. Furthermore, since it is possible to connect the DC-DC-converter modules in parallel, a high degree of flexibility and scalability may be achieved, as high current on one contact or balanced currents at a plurality of contacts is possible. The proposed limiting circuitry may also be failure tolerant, since DC-DC sourced contacts can even accept one or more poorly connected contacts, as the control mechanism may control all parallel DC-DC-converters for failure compensation. Such a control mechanism may lead, in turn, to a high up-time, a small risk of a repeated testing, and high-yield. By reliably limiting current and/or voltage, damage of a DUT may be reliably prevented. Since the construction of a limiting circuitry according to exemplary embodiments is very simple, the manufacturing effort may be kept at a reasonable level.

In the following, further exemplary embodiments of the limiting circuitry, the tester, and the method will be explained.

In the context of the present application, the term "limiting circuitry" may particularly denote circuitry configured for preventing excessive electric current, electric voltage and/or electric power to be supplied to one or more devices under test. In particular, current or voltage limiting may denote the task of imposing a limit on the current or the voltage that may be delivered to the DLT to protect a circuit generating or transmitting the current or voltage against undesired phenomena, for example due to a short-circuit or an overload. The term current or voltage limiting may also define a type of overcurrent or overvoltage protection. In particular, limiting circuitry may comprise, for example, at least one hard-wired electronic component, at least one monolithically integrated circuit and/or at least one software element. By limiting the current applied by a tester to a device under test by electric contacts, melting of electric contacts (such as needles) may be prevented.

In the context of the present application, the term "device under test" (DUT) may particularly denote an electronic component such as a semiconductor wafer or a (in particular bare or encapsulated) semiconductor chip which shall be tested concerning its desired functionality after manufacture. In particular, the device under test may be an electronic member configured as a power semiconductor wafer or chip, for example for automotive applications. By a tester and/or a limiting circuitry according to an exemplary embodiment, it is also possible to operate a plurality of DUTs simultaneously. For instance, a number of DUTs being tested at the same time may be in a range from 2 to 50, in particular in a range from 5 to 30, for example 16.

In the context of the present application, the term "direct current-direct current-converter" (DC-DC-converter) may particularly denote an electronic circuit or electromechanical device that converts a source of direct current (DC) from one voltage level to another voltage level. In particular, a DC-DC-converter may be an electric power converter. According to an embodiment, a plurality of DC-DC-converters are connected in parallel. For instance, a number of DC-DC-converters of a limiting circuitry may be in a range from 2 to 100, in particular in a range from 3 to 100, more particularly in a range from 10 to 50, for example 25.

In the context of the present application, the term "control mechanism" may particularly denote one or more entities (such as circuitry in form of one or more hard-wired components, integrated circuit components and/or software) configured for controlling DC-DC-converters. The control may be adjusted so that the provided DC-DC-functionality maintains an electric supply voltage and/or an electric supply current within desired limits, for instance predefined, predetermined or user-defined limits. Said limits may be static or dynamic. For example, such a control mechanism may be implemented at least partially apart from the DC-DC-converters and/or may be implemented at least partially inside of said DC-DC-converters. The mentioned control mechanism may include a feedback loop from an output of the DC-DC-converters back into the DC-DC-converters for regulating the performance what concerns current and voltage limitation.

In the context of the present application, the term "tester" (which may also be denoted as test cell) may particularly denote an apparatus configured for testing devices under test. For example, such a test may be a function test, an electronic test, a semiconductor test, etc.

In the context of the present application, the term "prober" may particularly denote a handling device for handling devices under tests, in particular semiconductor wafers, in terms of testing their functionality by a tester. A prober may bring electric contacts in physical contact with one or more devices under test for preparing and executing testing. In particular, a prober may be the mechanical part of a tester which may cooperate with an electric test unit. The prober may be a wafer-prober with which the tester can be used for wafer testing. In another embodiment, the prober may be configured for testing one or more separate molded packages.

In the context of the present application, the term "electric test unit" may particularly denote an electronic part of a tester in terms of testing devices under test. An electric test of such a device under test may require the application of electric stimulus signals to one or both opposing main surfaces of the device under test, for instance to pads of chips of a wafer. The test may also require the detection and processing of electric response signals in reply to the application of the stimulus signals, wherein the response signals may be detected from one or both opposing main surfaces of the device under test, depending on the particularities of a certain application.

In an embodiment, each of the plurality of direct current-direct current-converters is configured for providing a constant converted electric output current. In this context, the term "constant" may refer in particular to one testing cycle for one chip of the at least one DUT. Preferably, the "constant current" may be controlled to be smaller than a predefined threshold current to avoid burning of a probe. By providing a constant output current, the DC-DC-converter may directly ensure that no excessively high current is applied to an electric contact and from there to a DUT.

In an embodiment, each of the plurality of direct current-direct current-converters is configured for providing a converted electric output current which is stable or which is balanced. For instance in a scenario in which a first DUT is very clean, then every probe may receive its ideal current. Further considering that a second DUT has for example two pads which are contaminated, the responsive two probes may have different currents. When a third DUT has four pads which are contaminated, then the corresponding four probes may have different currents. While during testing one DUT, the output current can be constant, the output current of a DC-DC-converter may be controlled to be not constant, in particular may be dynamically re-balanced, when testing multiple DUTs in serial.

In an embodiment, the limiting circuitry comprises an alternating current-direct current-converter (AC-DC-converter) for converting an electric input alternating voltage into the electric input direct voltage provided to the plurality of direct current-direct current-converters. Hence, the mentioned AC-DC-converter may receive an alternating current on its input side, for example from a mains supply. Before suppling such electric supply power to the parallel arrangement of DC-DC-converters, the AC-DC-converter may generate a direct current on the basis of the supplied alternating current. For this purpose, is for instance possible to use rectifying diodes or the like. Preferably, a single AC-DC-converter may be provided for all parallel DC-DC-converters in common.

In an embodiment, the limiting circuitry comprises a current-to-voltage-converter configured for converting an overall actual electric current, indicating a sum of the electric output currents provided by the plurality of direct current-direct current-converters, into a voltage level used by the control mechanism for controlling the direct current-to-direct current converters. More specifically, the current-to-voltage-converter may be used for determining the cumulated currents flowing through individual paths from the DC-DC-converters to probes or electric contacts to the DUT. Furthermore, the current-to-voltage-converter may be used for supplying a corresponding sum signal in form of a voltage level, representing the cumulated currents, to an operational amplifier or another comparator. Said operational amplifier or other comparator may form part of the control mechanism. More generally, the current-to-voltage-converter may be connected between the parallel DC-DC-converters on the one hand and the electric contacts contacting the DUT on the other hand. The overall output currents of said DC-DC-converters may be converted into a voltage level provided at a separate terminal for use by the control mechanism for limiting the DC-DC-converters' current and/or voltage level.

In an embodiment, the control mechanism is configured for supplying a control signal, which depends on a predefined overall target electric current for all electric contacts being represented by a voltage level, to the plurality of direct current-direct current-converters. Thus, said voltage level may indicate a desired sum of individual current values provided as an output of the parallel DC-DC-converters. The value of the predefined overall target electric current may be defined so as to reliably avoid overcurrent, overvoltage and/or excessive power at the DUT. Information concerning the value of the predefined overall target electric current may be provided in the form of a voltage signal (denoted as "Itarget" in FIG. 1). Descriptively speaking, said voltage signal may indicate a desired overall current level to be supplied to a DUT. For example, applying a 4 V signal to an operational amplifier may represent a predefined overall target electric current corresponding to a current level of 4 Ampère.

In an embodiment, the predefined overall target electric current being represented by the voltage level is at least 0.1 Ampère, in particular at least 10 Ampère. In particular, a range of current can be from 0.1 Ampère to 100 Ampère, more particularly from 0.4 Ampère to 50 Ampère. Thus, the limiting circuitry may be configured for operating with very high current values where an overcurrent or overvoltage may cause significant damage. Hence, the reliability of the limiting circuitry may be of utmost advantage for such high current scenarios, which may occur for example in automotive applications.

In an embodiment, the control mechanism is configured for supplying a control signal, which depends on an overall actual electric current provided by the plurality of direct current-direct current-converters and being represented by a further voltage level (being determined and provided preferably by the above-described current-to-voltage-converter), to the plurality of direct current-direct current-converters. As the above discussed voltage level being indicative of a predefined overall target electric current, a further voltage level supplied by the current-to-voltage-converter may also be a voltage signal. The latter may represent the actual or real cumulated current level detected by the current-to-voltage-converter from the various direct current-direct current-converter outputs.

In an embodiment, the control mechanism is configured for supplying the control signal to the plurality of direct current-direct current-converters depending on a result of a comparison (in particular by a comparator) between the predefined overall target electric current for all electric contacts being represented by the above-mentioned voltage level and the overall actual electric current represented by the other above-mentioned voltage level. The above described voltage levels may be supplied to two inputs of a comparator (for example embodied as operational amplifier) for comparison. If the overall real or actual electric current is higher than the overall desired or target electric current, the control mechanism may control the DC-DC-converters to reduce current. If the overall real or actual electric current is smaller than the overall desired or target electric current, the control mechanism may control the DC-DC-converters to increase current.

In an embodiment, the control mechanism is configured for providing the direct current-direct current-converters with at least one sense signal sensed at the at least one device under test and being indicative of a voltage at at least one of the electric contacts for contacting the at least one device under test. By capturing a sense signal, a voltage drop at an electric contact may be estimated by detecting a contact resistance. For example, the sense signal may be a voltage signal representing a voltage drop at the DUT. For instance, said voltage drop may be a voltage drop of a needle, a probe, a tester and/or a contact surface. For instance, the sense signal may allow to detect the event that a DUT is contaminated (for example contaminated by a particle at a certain electric contact). Hence, detecting a sense signal directly at the DUT may provide meaningful information for correspondingly adapting the control provided from the control mechanism to the DC-DC-converters. Thus, the sense signal may be supplied to the DC-DC-converters as a further control signal.

In an embodiment, the control mechanism is configured for providing each of the direct current-direct current-converters with a voltage signal derived from another voltage signal which represents a target maximum power level to be provided to all direct current-to-direct current converters. Additionally or alternatively to the adjustment of the target current (as described above), the control mechanism may also take into account a predefined maximum power value which shall not be exceeded and which may be represented by a further voltage signal. The other voltage signal (which represents the target maximum power level) may be converted into the derived voltage signal by a driver for subsequent distribution to the various DC-DC-converters.

In an embodiment, the control mechanism is configured for controlling the direct current-direct current-converters for limiting an electric output voltage to not exceed a predefined threshold voltage value. Hence, the control logic can be configured so that the output voltage provided from the DC-DC-converters to the DUT is never excessively high. Hence, also an explicit voltage limitation may be implemented.

In an embodiment, the control mechanism is configured for controlling the direct current-direct current-converters so that different ones of the direct current-direct current-converters provide different values of the electric output current. Such a control may be static or dynamic. This provides a high flexibility of applying different current values to the different electric contacts, for instance in the event of a poor electric connection between an electric contact and the DUT which can be compensated by higher electric currents of the remaining electric contacts. Such a control logic may be embodied as a re-balancing configuration. For instance in a scenario in which one electric contact has a poor physical contact with the DUT (for example since a dust particle is in between), said electric contact may not contribute sufficiently to the provision of electric current to the DUT. If this happens, one or more other electric contacts may be controlled for providing additional electric current to the DUT to thereby partially or entirely compensate the electric contact(s) with poor physical contact with the DUT. Such a re-balancing may ensure proper operation of the limiting circuitry and of a tester even in the event of issues with contacts between DUT and test equipment.

In another embodiment, the control mechanism is configured for controlling the direct current-direct current-converters so that all direct current-direct current-converters provide the same value of the electric output current. For achieving this, all DC-DC-converters may be controlled for example by the same control signal. In such an embodiment, an equal distribution of the supply contributions of all DC-DC-converters may be ensured.

In an embodiment, the control mechanism is configured for automatically regulating the direct current-direct current-converters for limiting the electric output current. In particular, said control may be accomplished without intervention by a user. Advantageously, a fully automatic re-balancing of current may be provided by the control mechanism. There may be no need for a test engineer to intervene in a corresponding self-sufficient control mechanism.

In an embodiment, a part of the control mechanism is integrated in the plurality of direct current-direct current-converters and another part of the control mechanism is provided apart from the plurality of direct current-direct current-converters. Such an embodiment is shown for instance in FIG. 1 and FIG. 2, see reference signs 108. Alternatively, the control mechanism may be provided completely apart from the DC-DC-converters. In yet another embodiment, the control mechanism is entirely integrated in the DC-DC-converters.

In an embodiment, the control mechanism is configured for, in each of the direct current-direct current-converters:
  comparing (in particular by a first comparator) the electric output current of the respective direct current-direct current-converter with a sense signal sensed at at least one of the electric contacts of the at least one device under test and being indicative of a voltage (or a voltage drop) of the at least one device under test;
  further comparing (in particular by a further comparator) a result of said comparing (i.e. an output signal from said first comparator) with a predefined voltage signal being correlated with (for instance representing or being derived from) a maximum power to be provided to all direct current-to-direct current converters; and
  limiting (preferably based on an output signal of said further comparator) the electric output current of the respective direct current-direct current-converter if the result of the further comparing indicates a need for limiting (in particular if the result of the further comparing indicates that the electric output current has exceeded a critical threshold value).

Figure 2:
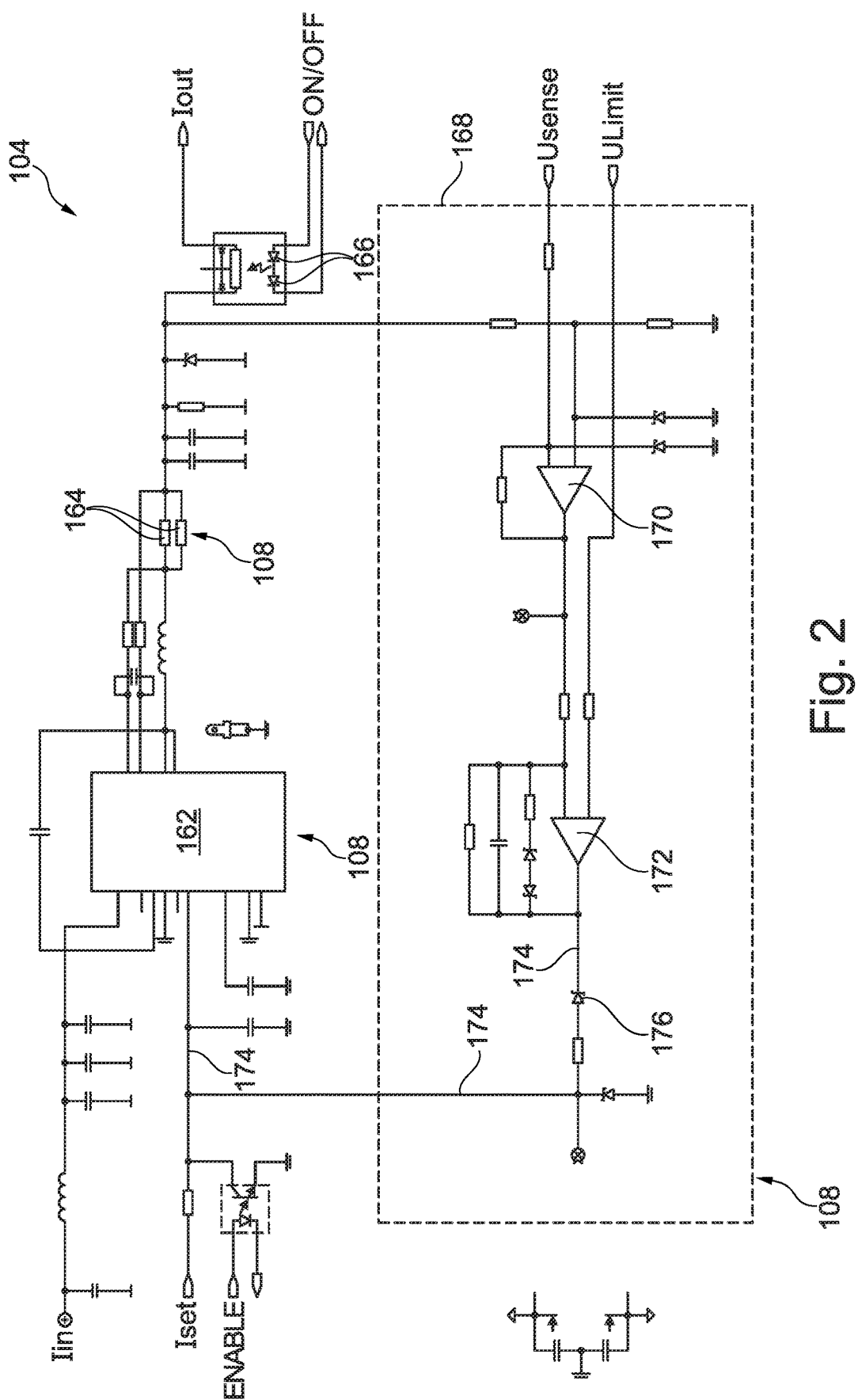
FIG. 2 shows a circuit diagram of a direct current-direct current-converter of the limiting circuitry according to FIG. 1.

Such a configuration relates for example to the embodiment shown in FIG. 2. Firstly, a voltage-related feedback signal from the DUT may be compared with an actual output signal of an individual DC-DC-converter. A result of this comparison may be subjected to a threshold analysis by comparing it with a maximum allowed power. If the result of this threshold analysis leads to the conclusion that the present power output of the DC-DC-converter is too high an output signal of the further comparator may be fed back to a DC-DC-conversion section of the DC-DC-converter for reducing the output current thereof.

In an embodiment, the tester is configured for testing a plurality of semiconductor chips on wafer level as devices under test. To put it shortly, a plurality of semiconductor chips may be still integrally connected with each other on a common base when the testing is executed. Using the disclosed limitation circuitry, a testing method may test integrally connected dies or chips of at least one wafer as the device(s) under test. In particular, a wafer having a diameter of at least 200 mm, more particularly at least 300 mm, may be tested. For instance, the method comprises testing, as the device under test, a wafer comprising a plurality of power semiconductor chips.

In another embodiment, the tester is configured for testing one or a plurality of separated encapsulated semiconductor chips as devices under test. For instance, the DUTs may be molded dies. Thus, the tester may be configured for testing a molded package or another single package. The tester may also be configured for testing a wafer as a whole.

In an embodiment, the method comprises testing a silicon carbide chip as device under test. For instance, a SiCMOS stress test may be executed. More generally, the method may comprise carrying out a semiconductor transistor chip stress test.

In an embodiment, the method comprises carrying out a high current direct current (DC) test. Thanks to the limiting circuitry, overcurrent and/or overvoltage may be reliably prevented during such a high current DC test.

In an embodiment, the method comprises carrying out a pulse test, i.e. at test during which a plurality of electric pulses are applied to the DUT. Due to the current and/or voltage limitation guaranteed by the limiting circuitry, there is substantially no limitation concerning the temporal length of pulses applied during pulse testing. For instance, such pulses may be longer than 100 ms.

In an embodiment, a tested DUT may comprise a transistor chip having a source pad, a drain pad and a gate pad as the at least one pad. In particular, the source pad and the gate pad may be formed on the same main surface of the electronic chip and may be each coupled with a respective contact element. The drain pad may be formed on an opposing other main surface of the electronic chip. Such a transistor chip may be a chip fulfilling the function of a transistor, in particular of a field effect transistor. Such a transistor chip may be used for instance for semiconductor power applications.

In an embodiment, the at least one tested DUT comprises at least one of the group comprising a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

According to an embodiment, a limiting circuitry for limiting current and/or voltage during a DUT test is provided. A parallel connection of DC-DC-converters may each convert an input into a converted output DC applied to electric contacts connected with the DUT. A control mechanism is functionally coupled with the DC-DC-converters and ensures that the provided current and/or voltage is limited to acceptable values, in particular does not exceed critically high values.

More specifically, a probe card for a high DC current test (such as a stress test) of a DUT (such as a silicon wafer) may be provided with high current DC-DC-converters to supply constant or balanced current to the DUT using several parallel DC-DC sourced contacts (such as needles, pogo pins, etc.). Preferably, a constant current output of each DC-DC-converter may be automatically adjusted (in particular limited), for instance to comply with one or more target values. Advantageously, said DC-DC-converters can be stacked in parallel to deliver higher overall current. Such a circuitry architecture may ensure a high DC and pulse current limitation at a DUT. Advantageously, such an architecture is freely scalable what concerns a number of high current sources.

By using controlled DC-DC-converter modules, it may be possible to supply the DUT(s) with power at high efficiency. What concerns flexibility, it may be possible to connect the DC-DC-converter modules in parallel, which may allow to selectively provide high current on one contact or balanced currents at a plurality of contacts. Moreover, a limiting circuitry according to an exemplary embodiment may have a high failure tolerance: By implementing parallel DC-DC sourced contacts (such as needles, pogo pins, etc.) on one contact pin or pad of a DUT, it may be possible to properly operate the limiting circuitry regardless of one or several bad contacts. This may be acceptable, since the sum current may be controlled for all parallel DC-DC channels. Advantageously, this may result in a higher up-time, less retest-risk and higher yield. Furthermore, exemplary embodiments may reliably prevent damage of a DUT during testing: Single contacts may be limited in the power output to prevent equipment and DUT damage. High ohmic contacts may be additionally lowered in output power. Furthermore, the overall effort for testing may be reduced, since a limiting circuitry may implement a complete source measure unit (SMU) for current controlled tests. Moreover, a limiting circuitry may reduce energy consumption and may thereby reduce emission of carbon dioxide due to a highly efficient conversion of current during testing, in particular during a stress test (which may take for example 15 minutes).

Some exemplary embodiments can be carried on testing a wafer, i.e, in a front end process, while some exemplary embodiments can be carried on testing encapsulated semiconductor packages, i.e., at a back end process. Exemplary embodiments may ensure that current and/or voltage may be reliably limited during a test.

FIG. 1 shows a limiting circuitry 100 for providing limited electric current, limited electric voltage and/or limited electric power for electrically testing a device under test (DUT) 102 according to an exemplary embodiment. The DUT 102 can be for example a semiconductor wafer with a plurality of still integrally connected semiconductor chips. The DUT 102 may also be a semiconductor package, for example an encapsulated semiconductor chip. Furthermore, the limiting circuitry 100 may also be configured for testing a plurality of DUTs 102 simultaneously.

The limiting circuitry 100 according to FIG. 1 comprises an alternating current-direct current-converter (AC-DC-converter) 110. The AC-DC-converter 110 receives, at its inlet, an electric input alternating voltage UAC from an AC supply (not shown), for example a mains supply. The AC-DC-converter 110 may be constructed for converting the electric input alternating voltage UAC into an electric input direct voltage UDCin at its outlet. For instance, the electric input direct voltage UDCin may be 24 V. The AC-DC-converter 110 may supply stable DC power. Appropriate AC-DC-converters suitable for use as AC-DC-converter 110, as described, are known by a person skilled in the art.

As shown in FIG. 1 as well, the electric input direct voltage UDCin may be provided to an inlet of each of a plurality of direct current-direct current-converters (DC-DC-converters) 104. The various DC-DC-converters 104 are connected in parallel to each other. Based on said electric input direct voltage UDCin, provided by the AC-DC-converter 110, each DC-DC-converter 104 is configured for providing a converted electric output current Iout. For example, the electric output current Iout may be 2 Ampère (wherein other current values are of course possible). Appropriate DC-DC-converters suitable for use as DC-DC-converter 104, as described, are known by a person skilled in the art and can be implemented in the embodiment of FIG. 1. However, the DC-DC-converter 104 shown in FIG. 2 and described below is a particularly appropriate choice.

Again referring to FIG. 1, limiting circuitry 100 furthermore comprises a current-to-voltage-converter 112 (which may also be denoted as I/U converter). For example, current-to-voltage-converter 112 may be embodied as a magnetic transducer. The current-to-voltage-converter 112 is configured for converting an overall actual electric current, indicating a sum of the individual electric output currents Iout, Iout, . . . provided by each of the plurality of DC-DC-converters 104, 104, . . . into a voltage level Isum. Just as an example, if 25 parallel connected DC-DC-converters 104 are provided and if each electric output current Iout provides an individual actual electric current of 2 Ampère, the sum of the electric output currents amounts to 50 Ampère. The latter mentioned sum current value may be represented by a voltage level Isum output by the current-to-voltage-converter 112. More specifically, said voltage level Isum may be output to a comparator 150 of a control mechanism 108 described below in further detail.

Apart from this, the electric output currents Iout, Iout, . . . provided by each of the plurality of DC-DC-converters 104, 104, . . . and relating to corresponding electric output voltages Uout, Uout, . . . pass through the current-to-voltage-converter 112 and are each forwarded to an assigned one of electric contacts 106 for contacting the illustrated DUT 102. For example, each electric contact 106 may be configured for providing an electrically conductive physical contact with one or more pads 152 of the DUT 102. For instance, each electric contact 106 may be a separate probe, such as a contact needle or a pogo pin. According to FIG. 1, a single common electrically conductive pad 152 of the DUT 102 is provided for all electric contacts 106 together.

However, as shown in FIG. 1, one of the current supplying electric contacts 106 is unintentionally only poorly—or not at all—in electric contact with pad 152 due to an unintentional foreign particle 154, for instance dust or dirt. Under these circumstances, it is not possible to properly conduct electric current to the DUT 102 by the electric contact 106 being contaminated with the foreign particle 154.

Preferably, each of the plurality of DC-DC-converters 104 may be configured for providing a constant or a re-balanced converted electric output current Iout. For instance in the described scenario in which one electric contact 106 has a poor physical contact with the DUT 102 due to the artificial foreign particle 154 in between, said electric contact 106 may not contribute sufficiently to the provision of electric current to the DUT 102. In this scenario, a control mechanism 108 may be configured for controlling the other DC-DC-converters 104, not relating to the electric contact 106 being contaminated with the foreign particle 154, to re-balance their provided output currents Iout to at least partially compensate the reduced electric current provided by the bad electric contact 106 contaminated with foreign particle 154. For instance, the remaining DC-DC-converters 104 may be re-balanced, in particular under control of control mechanism 108, so as to be operated with a correspondingly higher current above 2 Ampère.

Furthermore, the control mechanism 108 of the limiting circuitry 100 of FIG. 1 may be configured for controlling the DC-DC-converters 104 for limiting the electric output current Iout and/or the electric output voltage Uout which relates to said electric output current Iout. In particular, the control mechanism 108 may be configured for ensuring that electric current and electric voltage (and thereby also electric power being the product of electric current and electric voltage) are limited to not exceed critical values. In the shown embodiment, several constituents—which will be described below in further detail—of the control mechanism 108 are provided separately from the DC-DC-converters 104, whereas another part of the control mechanism 108 may be integrated into the DC-DC-converters 104 (as described below referring to FIG. 2).

In the following, construction and operation of the control mechanism 108 for providing the current and/or voltage limiting functionality will be described in further detail.

Still referring to FIG. 1, the control mechanism 108 is configured for supplying a control signal Iset to some or each of the DC-DC-converters 104. More precisely, the control signal Iset is provided at an outlet of the above-mentioned comparator 150. Said comparator 150 receives, at a first inlet, the above described voltage level Isum as provided by the current-to-voltage-converter 112. It is recalled that an overall actual electric current provided by the plurality of DC-DC-converters 104 and determined by the current-to-voltage-converter 112 is represented by said voltage level Isum. Moreover, for determining the control signal Iset, the comparator 150 receives, at a second inlet, a predefined overall target electric current for all electric contacts 106 which is represented by a voltage level Itarget. For example, with the given number of 25 DC-DC-converters 104 and an individual target current per DC-DC-converter of 2 Ampère, the voltage level Itarget may be set to a value corresponding to an overall target current of 50 Ampère. The control mechanism 108 may then be configured for supplying the control signal Iset to the plurality of DC-DC-converters 104 as an output of the comparator 150 corresponding to a difference between the voltage level Itarget and the voltage level Isum. By this functionality of comparator 150 being connected in a feedback loop from current-to-voltage-converter 112 back to the array of DC-DC-converters 104, an overcurrent can be reliably prevented. This may protect the DUT 102 against damage.

Apart from this, the control mechanism 108 is configured for providing the DC-DC-converters 104 as a further control signal, with a sense signal USense sensed at the common pad 152 (or alternatively at a separate pad, not shown) of DUT 102. The sense signal USense may be indicative of a voltage at the electric contact 106 to the DUT 102 by which the sense signal USense is detected. To put it shortly, the sense signal USense may allow to assess a voltage drop between output voltage of a DC-DC-converter 104 and the voltage at the pad/pin 152. If the voltage drop exceed a critical value, the current, voltage and/or power provided by the DC-DC-converters 104 may be adjusted correspondingly.

Next, a specific power-limiting feature of the control mechanism 108 will be explained: Again referring to FIG. 1, the control mechanism 108 may be configured for providing each of the DC-DC-converters 104 with a voltage signal Ulimit as another control signal. Said voltage signal Ulimit may be derived from another voltage signal Pmax which represents a predefined maximum power to be provided to all DC-DC-converters 104. For example, the voltage signal Pmax may indicate a predetermined level of maximum power allowed by limiting circuitry 100. The voltage signal Pmax may be provided to a driver 158 which generates on this basis the voltage signal Ulimit. Descriptively speaking, driver 158 functions as a signal distributor for distributing the maximum power-defining signal to all DC-DC-converters 104. The driver 158 outputs a voltage level being appropriate for the individual DC-DC-converters 104.

As already mentioned, the control mechanism 108 may be configured for controlling the DC-DC-converters 104 so that all DC-DC-converters 104 provide the same value of the electric output current Iout, for example 2 Ampère. However, the control mechanism 108 may also be configured for controlling the DC-DC-converters 104 so that different ones of the DC-DC-converters 104 provide different values of the electric output current Iout. For example, a subset of the DC-DC-converters 104 may be controlled to output a higher current than one or more other DC-DC-converters 104. For instance, some DC-DC-converters 104 may provide more than 2 Ampère in order to compensate a bad electric contact 106 being contaminated by a foreign particle 154. However, controlling different DC-DC-converters 104 to output different current levels may also be advantageous when different DUT pads require different current levels.

Advantageously, the control mechanism 108 is configured for automatically regulating the DC-DC-converters 104 for limiting current, voltage and/or power without intervention by a user. Thus, a test engineer does not have to care about such a limitation when executing the test in a fully automated manner.

Thus, FIG. 1 illustrates a high current multiple DC-DC-converter-based limiting circuitry 100 according to an exemplary embodiment. The AC-DC-converter 110 delivers a constant voltage supply for several DC-DC-converters 104. The DC-DC-converters 104 can be easily stacked in parallel to deliver higher currents (offering scalability and modularity). With the Ulimit-based control, an adjustment of a maximum power provided to each electric contact 106 (for example needle) can be adjusted for improving operation safety. In an embodiment, a constant current output per single DC-DC-converter 104 may be automatically adjusted according to the predefined Itarget value. The embodiment of FIG. 1 is particularly appropriate for high current DC and pulse tests. The limiting circuitry 100 according to FIG. 1 provides a low power loss due to the array of DC-DC-converters 104. For example, an input to output efficiency of 90% or more may be achieved.

FIG. 2 shows a circuit diagram of a DC-DC-converter 104 of the limiting circuitry 100 according to FIG. 1. As indicated by reference signs 108 in FIG. 2, a part of the control mechanism 108 may be integrated in the illustrated DC-DC-converter 104, whereas another part of the control mechanism 108 can be provided apart from the DC-DC-converter 104 (see reference signs 108 in FIG. 1). However, a skilled person will understand that FIG. 2 is only an example for the construction of such a DC-DC-converter, and that many alternatives are possible. Various signals are shown in FIG. 2 which may be applied to the various terminals of DC-DC-converter 104 and which relate to the corresponding signals in FIG. 1.

A supply signal from AC-DC-converter 110, denoted as electric input direct voltage UDCin in FIG. 1, is indicated by a corresponding electric input current Iin in FIG. 2. Substantially, said electric input current Iin is supplied to an inlet of a driver chip 162, which may be an LED (light emitting diode) driver integrated circuit. Furthermore, control signal Iset is supplied to a further inlet of driver chip 162. An output of driver chip 162 is supplied to selection resistors 164 for selecting a maximum current value. Descriptively speaking, cooperation of driver chip 162 and selection resistors 164 ensures that an electric current at a respective electric contact 106 does not exceed a predefined threshold value (for example 2.5 Ampère). Thereby, an overcurrent protection is provided.

An electric signal passing the selection resistors 164 may provide the electric output current Iout supplied to an assigned electric contact 106, as shown in FIG. 1. Furthermore, the electric signal passing the selection resistors 164 may also operate light emitting diodes 166.

In the following, construction and operation of a power loss limitation circuitry 168 of DC-DC-converter 104 of FIG. 2 will be explained:

The above-mentioned electric signal passing the selection resistors 164 and being indicative of the electric output current Iout may also be supplied to a first inlet of a first comparator 170 of the power loss limitation circuitry 168. First comparator 170 may function as a differential amplifier. At a second inlet of the first comparator 170, a sense signal USense sensed at one of the electric contacts 106 of the DUT 102 and being indicative of a voltage of the DUT 102 is provided. The sense signal USense has been explained referring to FIG. 1.

The first comparator 170 compares the electric output current Iout with the sense signal USense and provides a result of said comparison to a first inlet of a second comparator 172 of the power loss limitation circuitry 168. At a second inlet of the second comparator 172, the above-described predefined voltage signal Ulimit being correlated with a maximum power (see Pmax in FIG. 1) to be provided to all DC-DC-converters 104 is provided. At an outlet of the second comparator 172, a result of said comparison between the output signal of said first comparator 170 and Ulimit is provided. Second comparator 172 may function as an integrator amplifier.

The signal at the outlet of the second comparator 172 may be supplied, through a diode 176 and by a feedback loop 174, to a signal line to which control signal Iset is applied. Correspondingly, the feedback signal provided by the power loss limitation circuitry 168 may characteristically influence control signal Iset.

In particular, the feedback signal may limit the electric output current Iout of the DC-DC-converter 104 if the result of the comparison executed by the further comparator 172 indicates a need for limiting. For example, the diode 176 has a high output if a contact element 106 assigned to the DC-DC-converter 104 works properly. However, if the contact element 106 assigned to the DC-DC-converter 104 does not work properly (for instance due to the presence of a foreign particle 154), the diode 176 has a low output so that the electric signal supplied by DC-DC-converter 104 to DUT 102 is limited.

With the design of DC-DC-converter 104 according to FIG. 2, a high efficiency (for example of 90% or more) may be obtained. Furthermore, the architecture of the DC-DC-converter 104 according to FIG. 2 turned out as being appropriate for a parallel DC-DC-modules architecture. Furthermore, failure tolerance and power limitation for high-ohmic contacts turned out as advantageous as well with the configuration of FIG. 2.

Figure 3:
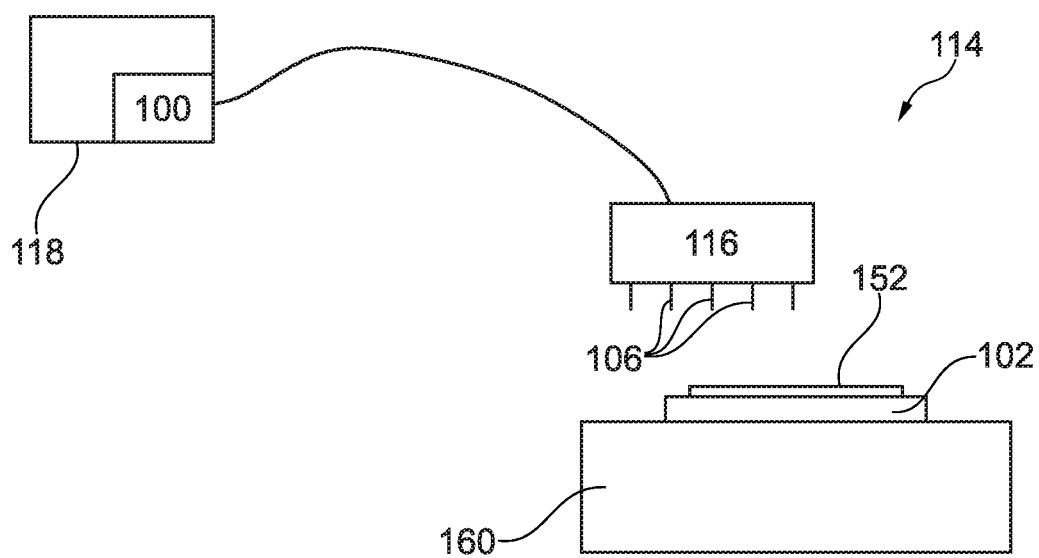
FIG. 3 shows a schematic view of a tester comprising an electric test unit with limiting circuitry according to FIG. 1 and a prober according to an exemplary embodiment.

FIG. 3 shows a schematic view of a tester 114 comprising an electric test unit 118 with limiting circuitry 100 (for instance embodied according to FIG. 1 and FIG. 2) and a prober 116 according to an exemplary embodiment.

The prober 116 may function as a probe card and may apply electric signals and/or electric power via electric contacts 106 (such as needles) to one or more pads 152 (one is shown in FIG. 3) of DUT 102. One or more DUTs 102 being presently tested may be mounted on a support 160. The prober 116 and/or the support 160 together with one or more DUTs 102 may then be moved into functional contact.

The electric test unit 118 comprises the above-described limiting circuitry 100 and is electrically coupled with the prober 116. Consequently, the electric test unit 118 is configured for supplying electric signals to the at least one DUT 102 and for receiving and analysing a plurality of response signals from the at least one DUT.

With the tester 114, it may be possible to test a plurality of semiconductor chips on wafer level as DUT 102. However, the tester 114 may also be configured for testing a plurality of separated encapsulated semiconductor chips, such as molded packages, as DUTs 102. In particular, silicon carbide chips may be tested as DUTs 102 by carrying out a high current direct current pulse test, such as a stress test.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. Limiting circuitry for providing limited electric current and/or limited electric voltage for electrically testing at least one device under test, wherein the limiting circuitry comprises:
   a plurality of DC-DC-converters being connected in parallel to each other, each being provided with an electric input DC voltage and a set current control signal and each being configured for providing a converted electric output current based on the set current control signal to be forwarded to an assigned one of electric contacts for contacting the at least one device under test; and
   control circuitry configured for controlling the DC-DC-converters for limiting the electric output current and/or an electric output voltage which relates to said electric output current.

2. The limiting circuitry according to claim 1, wherein each of the plurality of DC-DC-converters is configured for providing a constant converted electric output current.

3. The limiting circuitry according to claim 1, comprising an AC-DC-converter for converting an electric input AC voltage into the electric input DC voltage provided to the plurality of DC-DC-converters.

4. The limiting circuitry according to claim 1, comprising a current-to-voltage-converter configured for converting an overall actual electric current provided by the plurality of DC-DC converters, indicating a sum of the electric output currents provided by the plurality of DC-DC-converters, into a voltage level used by the control circuitry for controlling the DC-to-DC converters.

5. The limiting circuitry according to claim 1, wherein the control circuitry is configured for supplying the set current control signal, which depends on a predefined overall target electric current to be supplied to the at least one device under test for all electric contacts being represented by a voltage level, to the plurality of DC-DC-converters.

6. The limiting circuitry according to claim 5, wherein the predefined overall target electric current being represented by the voltage level is at least 0.1 Ampère, in particular at least 10 Ampère.

7. The limiting circuitry according to claim 1, wherein the control circuitry is configured for supplying the set current control signal, which depends on an overall actual electric current provided by the plurality of DC-DC-converters and being represented by a voltage level, to the plurality of DC-DC-converters.

8. The limiting circuitry according to claim 5, wherein the control circuitry is configured for supplying the set current control signal to the plurality of DC-DC-converters depending on a result of a comparison between the predefined overall target electric current and an overall actual electric current provided by the plurality of DC-DC-converters represented by a voltage level.

9. The limiting circuitry according to claim 1, wherein the control circuitry is configured for providing the DC-DC-converters with at least one sense signal sensed at the at least one device under test and being indicative of a voltage at at least one of the electric contacts for contacting the at least one device under test.

10. The limiting circuitry according to claim 1, wherein the control circuitry is configured for providing each of the DC-DC-converters with a voltage signal based on another voltage signal which represents a maximum power to be provided to all DC-to-DC converters.

11. The limiting circuitry according to claim 1, wherein the control circuitry is configured for controlling the DC-DC-converters for limiting an electric output voltage to not exceed a predefined threshold voltage value.

12. The limiting circuitry according to claim 1, wherein the control circuitry is configured for controlling the DC-DC-converters so that different ones of the DC-DC-converters provide different values of the electric output current.

13. The limiting circuitry according to claim 1, wherein the control circuitry is configured for controlling the DC-DC-converters so that all DC-DC-converters provide the same value of the electric output current.

14. The limiting circuitry according to claim 1, wherein the control circuitry is configured for automatically regulating the DC-DC-converters for limiting the electric output current, in particular without intervention by a user.

15. The limiting circuitry according to claim 1, wherein a part of the control circuitry is integrated in the plurality of DC-DC-converters and another part of the control circuitry is provided apart from the plurality of DC-DC-converters.

16. The limiting circuitry according to claim 1, wherein the control circuitry is configured for, in each of the DC-DC-converters:
- comparing the electric output current of the respective DC-DC-converter with a sense signal sensed at at least one of the electric contacts of the at least one device under test and being indicative of a voltage of the at least one device under test;
- further comparing a result of said comparing with a predefined voltage signal being correlated with a maximum power to be provided to all DC-to-DC converters; and
- limiting the electric output current of the respective DC-DC-converter if the result of the further comparing indicates a need for limiting.

17. A tester for testing at least one device under test, wherein the tester comprises:
- a prober for contacting the at least one device under test for testing the at least one device under test; and
- an electric test unit comprising a limiting circuitry according to claim 1 and being coupled with the prober for supplying electric signals to the at least one device under test and for receiving and analysing a plurality of response signals from the at least one device under test.

18. The tester according to claim 17, comprising at least one of the following features:
- the tester is configured for testing a plurality of semiconductor chips on wafer level as devices under test; and
- the tester is configured for testing a plurality of separated encapsulated semiconductor chips as devices under test.

19. A method of limiting electric current and/or electric voltage for electrically testing at least one device under test, wherein the method comprises:
- connecting a plurality of DC-DC-converters in parallel to each other;
- providing each of the DC-DC-converters with an electric input direct voltage and a set Current control signal;
- generating, by the DC-DC-converters, a converted electric output current based on the set current control signal to be forwarded to an assigned one of electric contacts for contacting the at least one device under test; and
- controlling the DC-DC-converters for limiting the electric output current and/or an electric output voltage which relates to said electric output current.

20. The method according to claim 19, wherein electrically testing the at least one device under test comprises at least one of the following:
- testing a plurality of semiconductor chips on wafer level as devices under test;
- testing a plurality of separated encapsulated semiconductor chips as devices under test; or
- testing a silicon carbide chip as device under test.

* * * * *